United States Patent [19]

Lawter

[11] Patent Number: 4,506,261

[45] Date of Patent: Mar. 19, 1985

[54] INTEGRATED GAS DISCHARGE DISPLAY PANEL

[75] Inventor: Raymond L. Lawter, Zanesville, Ohio

[73] Assignee: NCR Corporation, Dayton, Ohio

[21] Appl. No.: 392,432

[22] Filed: Jun. 28, 1982

[51] Int. Cl.³ ............................................. G09G 3/14
[52] U.S. Cl. .................................. 340/718; 340/719; 340/758; 313/519
[58] Field of Search ............... 340/718, 719, 758, 771, 340/779; 315/73; 313/517, 518, 519, 520, 521, 284, 289, 586, 587, 623

[56] References Cited

U.S. PATENT DOCUMENTS

| | | | |
|---|---|---|---|
| 3,327,154 | 6/1967 | Bowerman | 313/519 |
| 3,701,918 | 10/1972 | Allen et al. | 340/758 |
| 4,103,208 | 7/1978 | Washizuka | 340/719 |
| 4,122,376 | 10/1978 | Mera et al. | 313/519 |

Primary Examiner—Gerald L. Brigance
Attorney, Agent, or Firm—J. T. Cavender; Wilbert Hawk, Jr.; Richard W. Lavin

[57] ABSTRACT

A display device comprising a transparent substrate bonded to a portion of a printed circuit board forming the display envelope, the circuit board including a plurality of electrical conductors. A first portion of the electrical conductors has one end forming the cathode electrodes of the display and its other ends connected to electrical control elements mounted on the circuit board adjacent the display envelope. Anode electrodes of the display are mounted on the substrate and are connected to a second portion of the electrical conductors by metal connectors located within the display envelope. The second portion of the electrical conductors are also connected to the electrical control elements which control the operation of the display.

4 Claims, 12 Drawing Figures

FIG. 4B ROW 1 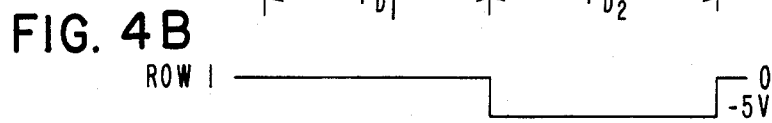
FIG. 4C ROW 7 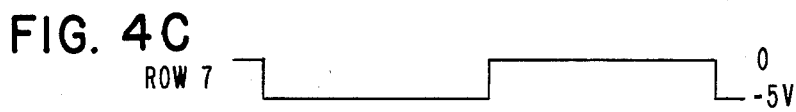
FIG. 4D COL 1 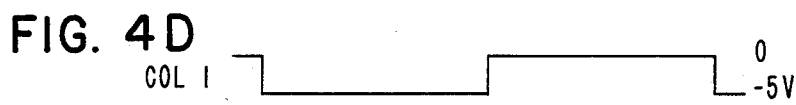
FIG. 4E COL 2 

INTEGRATED GAS DISCHARGE DISPLAY PANEL

BACKGROUND OF THE INVENTION

The present invention relates to AC gas display devices which are capable of producing a visual display representing data such as numerals, letters and the like associated with data terminal devices and more particularly, to an integrated gas discharge display device in which a portion of the display device includes the electrical control elements which operate the display device.

Present day display apparatuses found in data terminal devices are generally of the gas discharge type in which the display panel is mounted within the terminal device and is connected to the electronics of the terminal device for controlling the operation of the display device. Conventional display devices utilize two sheets of glass which constitute the display envelope and which construction generates problems resulting in low yields due to breakage, handling, etc. Additional production and reliability difficulties are generated with the hermetic seal between the sheets of glass due to the large number of electrical connections which must be made to the internal gas discharge electrodes and which must pass through the marginal seals between the glass and the electrical connections. Microscopic air permeable pores frequently develop along such seals during manufacturing, which are difficult to detect. This porosity slowly admits atmospheric air into the low pressure gas chamber, thereby shortening the useful life of the display panel. Because of moisture and corrosion, problems have also developed in the electrical connections and components which operate the display device.

Various display panels have been proposed to overcome these problems. One such attempt is found in U.S. Pat. No. 3,828,215, to Bilaback, wherein the gas display panel has been mounted with a printed circuit board on which are mounted the various electrical components used in operating the display panel. However, the electrical connections of the panel extend through the glass envelope for connection to the electrical conductors of the circuit board, thus still exhibiting the porosity problems detailed above. It is therefore a principal object of the present invention to provide a novel self-contained gas discharge display panel. It is another object of this invention to provide a gas discharge display panel which is compact in construction. It is a further object of this invention to provide a gas discharge display panel which is efficient and reliable in its operation but is inexpensive to manufacture and maintain.

SUMMARY OF THE INVENTION

These and other objects of the invention are fulfilled by providing a unique gas discharge display panel which comprises a printed circuit board having secured thereto a clear substrate which comprises one side of the display envelope. The clear substrate is sealed at its junction with the circuit board providing an air-tight chamber. Electrodes serving as the cathode and anode of the display panel are connected to the electrical conductors of the printed circuit board and the electrical components used for operating the display device are mounted to the printed circuit board in contact with such electrical conductors.

BRIEF DESCRIPTION OF THE DRAWINGS

The foregoing and various other objects, advantages and meritorious features of the present invention will be apparent from the following detailed description and appended claims when read in conjunction with the drawings, wherein like numerals identify corresponding elements.

FIGS. 4A-4I inclusive illustrate various waveforms used in the drive circuit of FIG. 3.

DESCRIPTION OF THE PREFERRED EMBODIMENT

Figure 1:
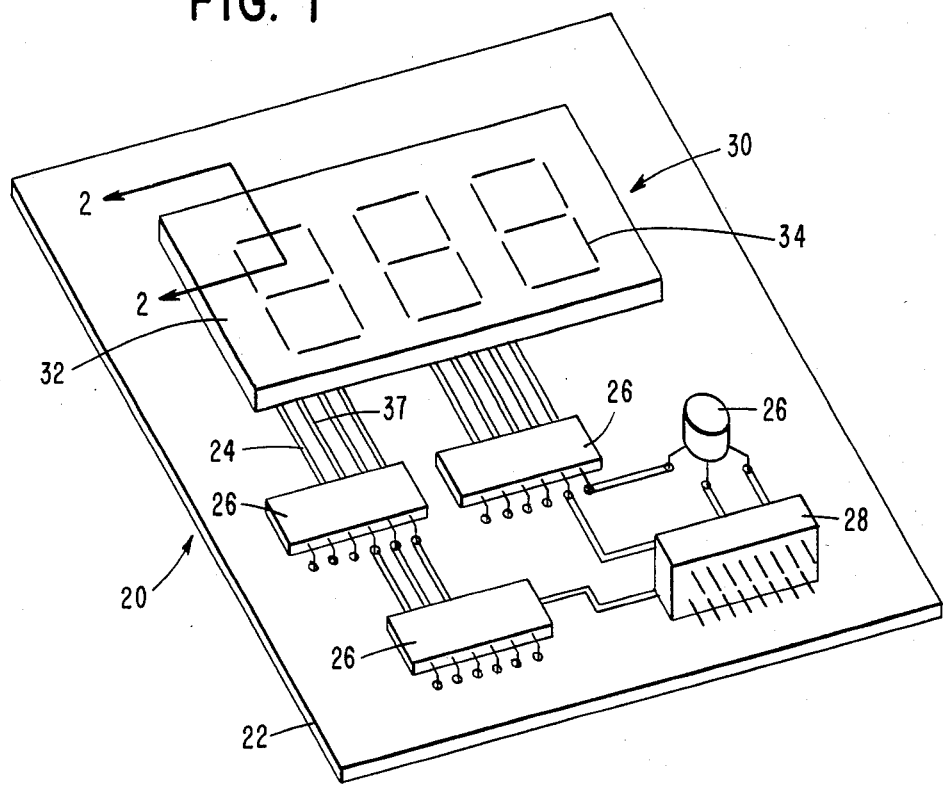
FIG. 1 is a perspective view of the display panel showing the location of the electrical components on the printed circuit board with respect to the display envelope.

Referring now to FIG. 1, there is shown a perspective view of the gas discharge display panel of the present invention generally indicated by the numeral 20 which includes a printed circuit board 22 composed of conventional epoxy resin reinforced with glass fibers, such as Nema grade FR-4. Located within the printed circuit board 22 are a plurality of sets of metallized conductors 24 and 37 which interconnect a plurality of integrated circuit packages 26 and a connector plug 28 to which is attached a cable (not shown), over which cable signals representing the data to be displayed in the display device 20 are received from a terminal or similar input device associated with the display device.

Figure 2:
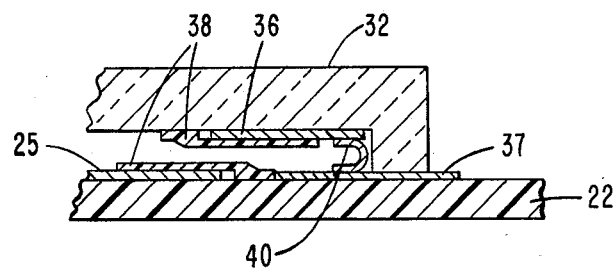
FIG. 2 is a partially enlarged sectional view of the display panel taken along lines 2—2 of FIG. 1 showing the electrical connections between the electrodes of the gas display envelope and the electrical conductors located in the printed circuit board.

The conductors 24 and 37 extend to a position within a gas display envelope 30 which includes a transparent cover plate 32 (FIGS. 1 and 2) composed of a rigid allyl diglycol carbonate or any other appropriate type of high temperature plastic or glass material and which is secured to the printed circuit board 22 by any one of many commercially available sealants developed for use with plastics and the like. The cover plate 32 is designed to provide a 0.009 inch gap between the inner surfaces of the cover plate 32 and the printed circuit board 22 which is partially back-filled with a gas mixture of 0.1 to 0.8% argon and 99.5% neon at 300 torr vacuum. The end portions of one set of the conductors 24 are orientated within the display envelope 30 as the cathode electrode or element 25 of a given digit configuration 34 (FIG. 1). As shown in FIG. 2, the inside surface of the cover plate 32 is coated with a transparent material 36 which comprises the anode electrode or element of the digit configuration 34 (FIG. 1). Such anode material 36 may comprise either indium oxide, tin oxide or milled powder metal in a carrier such as Dow Corning Arc, a trademark of the Dow Corning Corporation of Midland, Mich. Both the anode 36 and the cathode elements 25 are coated with a dielectric capacitive coating 38 such as magnesium oxide which protects the anode and cathode surfaces from corrosion by electron bombardment. Each of the anode elements 36 is connected to the second set of conductors 37 located in the printed circuit board 22 by metal clips 40 or any other type of metallic connection located within the envelope 30.

Figure 3:
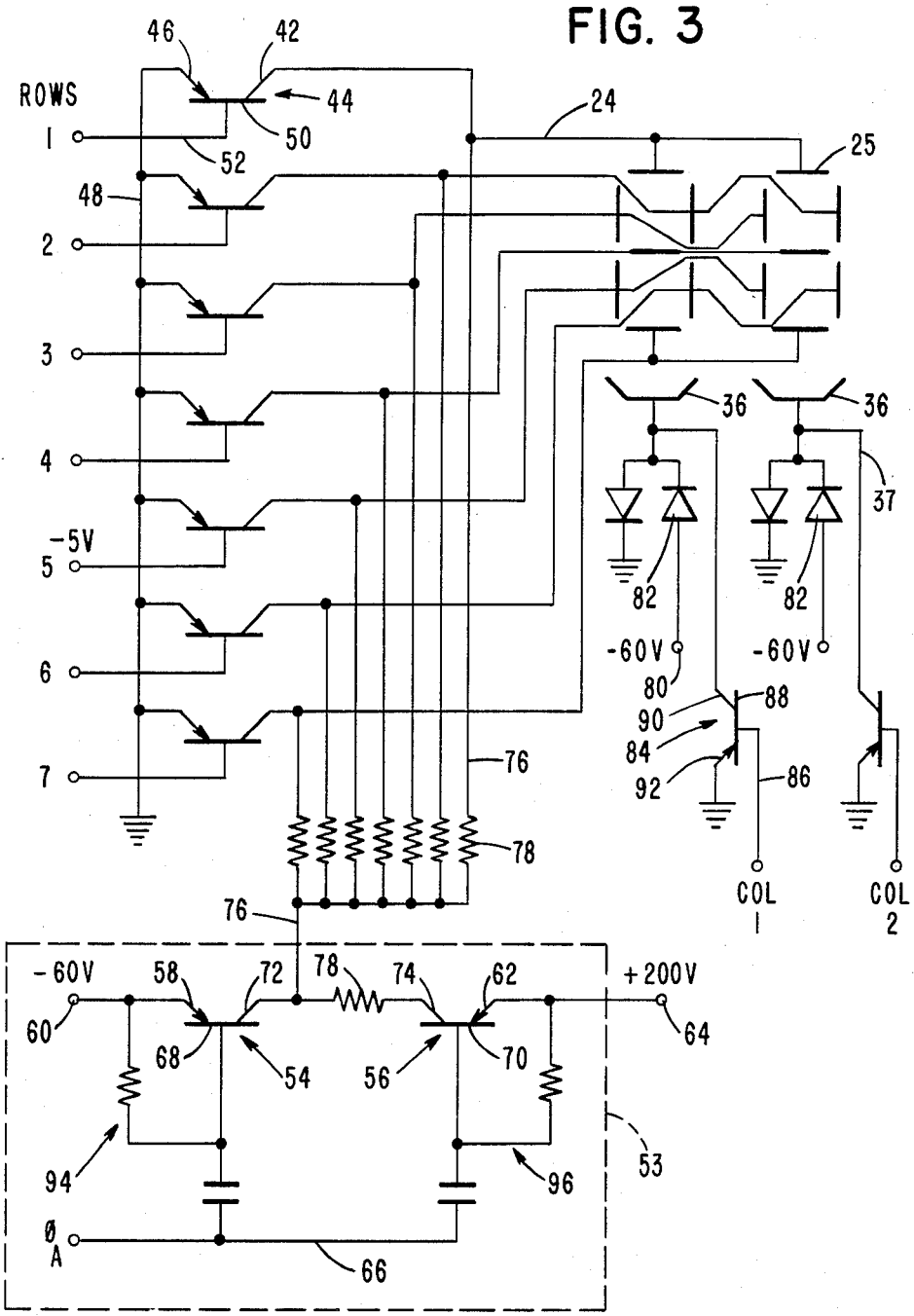
FIG. 3 is a schematic diagram of a drive circuit for energizing the gas discharge panel of the present invention.

Referring now to FIG. 3, there is disclosed a schematic diagram of a control circuit which may be employed to control the operation of the display panel 20. As is well-known in the art, the digit configuration 34 (FIG. 1) located within the display envelope 30 is composed of parallel rows of cathode elements 25 and parallel columns of anode elements 36 which are connected to selection and addressing circuitry for enabling a selected digit to be displayed. In the present embodiment, there are seven rows of cathode elements 25 and two columns of anode elements 36 which may be selected in any combination to display any one of the numeral digits 0-9 inclusive. As shown in FIG. 3, each of the cathode elements 25 is connected over a conductor 24 to the collector 42 of a PNP low voltage transistor driver 44 whose emitter 46 is connected over conductors 48 to ground and whose base 50 receives selecting signals of 5 volts over conductor 52 from the terminal or other input device selecting the cathode elements 25 to be energized.

Figure 4A:
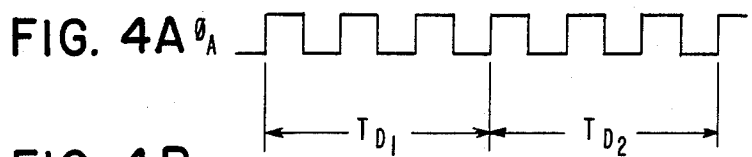

Also connected to each of the cathode elements 25 is a toggle circuit located within the block 53 for supplying high voltage pulses to the selected cathode elements. Included in the toggle circuit are a pair of high voltage PNP transistor drivers 54 and 56 with the emitter 58 of transistor 54 connected to a voltage source 60 supplying a negative 60 volts while the emitter 62 of the transistor 56 is connected to a voltage source 64 of 200 volts. Each of the transistors 54 and 56 is enabled by clock pulses $\phi_A$ (FIG. 4A) appearing on conductor 66 and which are transmitted to the base 68 of the transistor 54 and to the base 70 of the transistor 58.

The collectors 72 and 74 of the respective transistors 54 and 56 are connected over conductors 76 to the cathode electrodes or elements 25 for alternately supplying the high voltage pulses to the selected ones of such cathode elements 25. Resistors 78 in such conductors 76 limit the peak current across the gas during discharge of a cathode element 25. Each column of anode electrodes or elements 36 is connected to a negative 60 volts voltage source 80 which is transmitted to the anode element 36 through a diode 82. Associated with each of the anode elements 36 is a transistor 84 which, when energized by a selecting pulse appearing over conductor 86 to the base 88 of the transistor, enables the transistor to short the voltage pulse to ground through the collector 90 and the emitter 92 of the transistor.

Figure 4F:
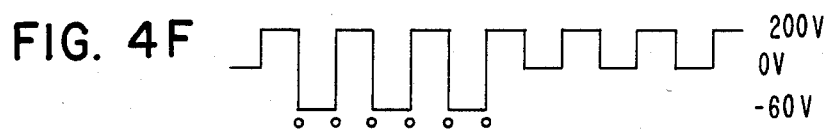
Figure 4G:
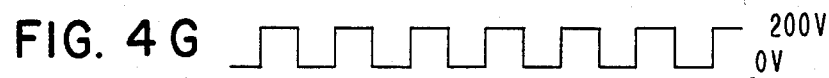
Figure 4H:
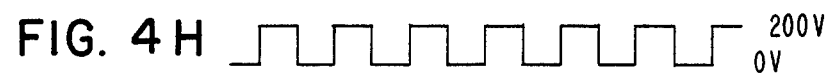

In the operation of the display panel 20, the clock signals $\phi_A$ (FIG. 4A) appearing on conductor 66 (FIG. 3) will alternately apply a 200 volt pulse and a negative 60 volt pulse over conductors 76 to the cathode elements 25, the timing of such pulses being controlled by the time constants of the RC networks generally indicated by the numerals 94 and 96 (FIG. 3). To select a row of cathode elements, the row select transistor driver 44 for the selected row is turned off by removing during the time period $T_{D1}$ (FIG. 4A) a negative 5 volt pulse (FIG. 4B) from the base of the transistor, enabling the row of cathode elements 25 to swing between a negative 60 volts and 200 volts (FIG. 4F) in phase with the frequency of the clock signals $\phi_A$ which in the present embodiment is 5 KHz. An unselected row of cathode elements (FIG. 4C) during the time period $T_{D1}$ will have its transistor driver 44 turned on by the application of a negative 5 volt pulse, thereby clamping the transistor driver on the low side over line 48 to ground and enabling the row to swing between 0 volts and 200 volts (FIGS. 4G and 4H) in phase with the frequency of the clock signals $\phi_A$.

To select a column of anode elements 36, the column select transistor driver 84 (FIG. 3) is turned on (FIG. 4D) during the time period $T_{D1}$ (FIG. 4A) by applying a negative 5 volts pulse to the base 88 of the transistor driver, thereby clamping the selected column of anode elements 36 to ground while the unselected column of anode elements (FIG. 4E) has, during the same time period, its transistor driver turned off, thus enabling the voltage applied to the anode elements 36 thereof to swing between a negative 60 volts and 0 volts. Grounding of the selected column of anode elements allows a voltage to be applied across the selected cell ionizing the gas from which light is emitted in a manner that is well-known in the art. Upon the ionization of the gas, current will flow across the cavity between the selected anode 36 and the cathode 25 elements charging the capacitive coatings 38 (FIG. 2) on the selected elements. When this occurs, the voltage drop across the two coatings begins to increase with an attending decrease in the voltage drop across the area between the cathode and the anode elements until the field across the gas is unable to keep the gas ionized. This action limits the current level in the operation of the A.C. display 20.

Figure 4I:
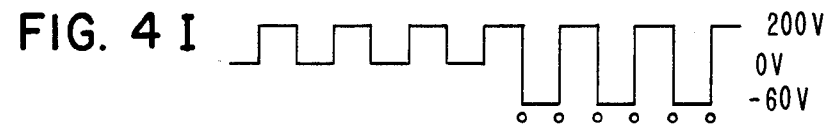

The cathode and anode elements located at the intersection of the selected row and selected column have a voltage swing between a negative 60 volts and 200 volts, thus producing a firing voltage between approximately 200 and 260 volts during the time period $T_{D1}$ (FIG. 4F) and the time period $T_{D2}$ (FIG. 4I) which occurs in phase with the frequency of the clock pulses $\phi_A$. The remaining half select cathode and anode elements (FIGS. 4G and 4H) in the selected row and selected column have a voltage swing of between 0 and 200 volts due to the unselected column anode element subtracting a negative 60 volts from the voltage swing of its associated unselected cathode element.

It will be seen from this construction that the display panel 20 provides a very compact and efficient display operation which enables the panel to be orientated on a data terminal device with a minimum amount of expense.

While the invention has been shown and described with reference to a preferred embodiment thereof, it will be understood that persons skilled in the art may make modifications thereof without departing from the spirit and scope of the invention as defined by the claims appended hereto.

I claim:

1. A gaseous display device comprising:
    a printed circuit board member having at least one surface of insulating material;
    a row of first electrical conductors located in said surface of insulating material and having one end portion being operated as a cathode electrode of a predetermined gas discharge pattern;
    a transparent cover having an inside surface mounted to one side of said insulating surface of the printed circuit board member enclosing said cathode electrodes and forming an air-tight chamber between the inside surface of the cover and the surface of the insulating material and filled with an ionizable gas capable of sustaining a gas discharge;
    a plurality of second electrical conductors located in said surface of insulating material and extending to a position within the chamber formed by said transparent cover;

a column of third electrical conductors disposed on said inside surface of the transparent cover within said chamber and operated as the anode electrode of a predetermined gas discharge pattern;

means mounted entirely within said chamber for interconnecting said second and third electrical conductors;

and electrical control means mounted on said printed circuit board adjacent said cover and engaging said first and second electrical conductors for generating control signals operating selected anode and cathode electrodes to produce a predetermined gas discharge pattern within said chamber of said display device.

2. A display device as in claim 1 wherein the anode and cathode electrodes are coated with a layer of capacitive material.

3. A display device as in claim 1 in which said third electrical conductors comprise transparent conductive strips of material.

4. A display device as in claim 1 wherein said interconnecting means comprises a U-shaped metal clip engaging said second and third electrical conductors for transmitting the control signals from said electrical control means to said third electrical conductors.

* * * * *